Feb. 4, 1958 P. L. BARGELLINI 2,822,523

SEMICONDUCTOR ANGLE MODULATOR CIRCUIT

Filed Oct. 31, 1956

INVENTOR.
Pier L. Bargellini
BY H. W. Newton
ATTORNEY.

United States Patent Office 2,822,523
Patented Feb. 4, 1958

2,822,523

SEMICONDUCTOR ANGLE MODULATOR CIRCUIT

Pier L. Bargellini, Morton, Pa., assignor to Radio Corporation of America, a corporation of Delaware Application October 31, 1956, Serial No. 619,506
5 Claims. (Cl. 332—16)

This invention relates to semiconductor angle modulation circuits, and more particularly to an angle modulator circuit utilizing multi-electrode semiconductor or transistor devices.

A transistor semiconductor device, as is well known, comprises a body of semiconductive material of one type of conductivity having at least two rectifying electrodes associated therewith. The rectifying electrodes may be PN junction electrodes and comprise zones of N type and P type conductivity material separated by rectifying barriers which have a high resistance to electrical current flow in one direction and a low resistance to such flow in the other direction. In such devices one of the rectifying electrodes may be operated as an emitter electrode and the other as a collector electrode. A base electrode is generally connected in ohmic, non-rectifying, contact with the semiconductor body and serves to control the current flow between the emitter and collector electrodes.

A special type of transistor having an emitter electrode, one or more collector electrodes, and several ohmic base contacts may be adapted, by the use of rotating electrical fields within the semiconductor body, to perform complex functions that may not be accomplished by ordinary transistors. Such multi-electrode transistors have been found to be useful in circuits for angle modulated waves, such as frequency or phase modulated waves.

It is an object of the invention to provide an improved angle modulator circuit utilizing a multi-electrode transistor or semiconductor devices as the active circuit element.

It is a further object of the invention to provide an improved multi-electrode transistor angle modulator circuit in which a rotating electrical field within the semiconductor body of the transistor is utilized to provide the desired modulation characteristics.

In accordance with the invention, an angle modulator circuit includes a multi-electrode transistor having an emitter electrode, a collector electrode, and pairs of diametrically opposed ohmic base contacts on the semiconductor body. Two 90° out-of-phase carrier signals are provided and applied to the pairs of base contacts to establish a rotating electrical field within the semiconductor body. A modulating signal is applied to amplitude modulate one of the carrier signals and an angle-modulated wave results, which may be derived from the collector electrode.

The invention may be further understood when the following description is read in connection with the accompanying drawing, in which.

Figure 1:
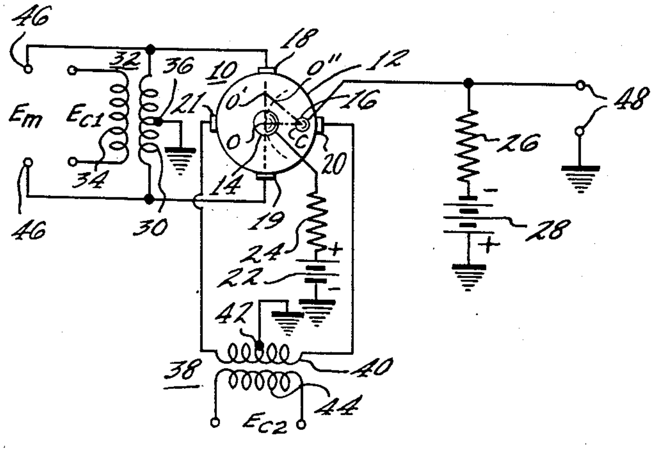
Figure 1 is a simplified schematic circuit diagram of an angle modulator circuit embodying the invention.

Referring now to Figure 1, a multi-electrode transistor or semiconductor device 10 comprises a flat, circular, wafer-shaped semiconductor body 12 which may be of N-type material as will be described herein. However, a P-type material may be used, as is well known, with a consequent change in the biasing potentials that are applied to the various electrodes. An emitter electrode 14 is located centrally on one surface of the semiconductor body 12 and a collector electrode 16 is located on the same surface as the emitter electrode 14 near the periphery of the semiconductor body 12. It should be noted that the collector electrode 16 may be also located on the opposite surface of the semiconductor body 12 but is here shown on the same surface to facilitate illustration of the circuit.

Two pairs of ohmic base contacts 18, 19 and 20, 21 are located equidistant from the emitter electrode 14 on the periphery of the semiconductor body 12 spaced equally apart and diametrically opposed. Bias is supplied to the emitter electrode 14 by connecting a source of bias voltage 22, here illustrated as a battery, between ground, or other point of reference potential for the circuit, and the emitter electrode 14 through an emitter resistor 24. Energizing potential is also supplied to the collector electrode 16 by connecting the collector electrode 16 through a load resistor 26 to the negative terminal of a second source of supply voltage 28, again illustrated as a battery having its positive terminal connected to ground or reference potential point.

In accordance with the invention, a pair of carrier frequency signals are applied to the ohmic base contacts 18, 19 and 20, 21. This is accomplished by connecting the ends of the secondary 30 of a first input transformer 32 to the first pair of base contacts 18, 19, and applying a first carrier voltage, $E_{C1}$, to the primary 34 of the first transformer 32. The secondary 30 of the transformer 32 may have a center tap 36 connected to ground. A second carrier voltage, $E_{C2}$, is similarly applied through a second transformer 38 to the second pair of base contacts 20, 21. The ends of the secondary winding 40 are directly connected to the second pair of base contacts 20, 21 and the center tap 42 of the secondary 40 is connected to ground. The second carrier, $E_{C2}$, has the same frequency as the first but is 90° out of phase with the first carrier signal, $E_{C1}$, and is applied to the primary winding 44 of the second transformer 38.

A modulating signal, $E_m$, is applied to the first pair of base contacts 18, 19 through a pair of modulation signal input terminals 46 connected to the secondary 30 of the first transformer 32, and thence to the base contacts. As will be more fully explained hereinafter, a carrier frequency wave, angle-modulated in accordance with the modulating signal, is derived at the collector electrode 16 with respect to ground, and applied to a pair of modulated signal output terminals 48, one of which is connected to the collector electrode 16 and the other of which is connected directly to ground.

In the absence of a modulating signal, the carrier wave signals, $E_{C1}$ and $E_{C2}$, which are 90° out of phase, are combined vectorially within the semiconductor body 12 of the transistor 10 to set up a rotating electrical field having an angular velocity $\omega_C$ equal to the angular frequency of the carrier signals. The collector current contains a large alternating component at the angular frequency $\omega_C$ of the carrier signals and has an amplitude which is dependent upon the distance from the center of the semiconductor body 12 beneath the emitter electrode 14 (designated in Figure 1 as point O) to the collector electrode 16 (designated as point C). This action, in effect, sets up a virtual base for the transistor device 10 within the semiconductor body 12 at the point O directly beneath the emitter electrode 14 and centrally located within the wafer.

As the modulating signal, $E_m$, is applied to the modulation input terminals 46, the first carrier voltage $E_{C1}$ will be affected in accordance with the modulating signal and the electrical field within the semiconductor body will be such as to move the virtual base (point O) along a straight line, indicated by the dotted line within the semiconductor body between the first pair of base contacts 18, 19. At one instant of time during a cycle of the modulating signal, $E_m$, the virtual base will be displaced from the center O to some point such as designated by point O′ along the dotted line between the first base contacts 18, 19. The collector current will now be represented in magnitude by the distance between O′ and C and have a phase angle with respect to the unmodulated collector current determined by the angle between the lines OC and O′C.

The character of the displacement of the virtual base from its central position, that is the displacement of O′ from O, is determined by the modulating signal. The instantaneous distance of O′ from O is determined by the instantaneous amplitude of the modulating signal and its direction is determined by the polarity of the signal. At every amplitude of the modulating signal, both positive and negative, it will be seen that the instantaneous position of the line O′C with respect to the line OC will produce a different phase angle, providing an alternating output signal at the collector electrode having an angular frequency, $\omega_C$, and angle modulated in accordance with the modulating signal.

Figure 3:
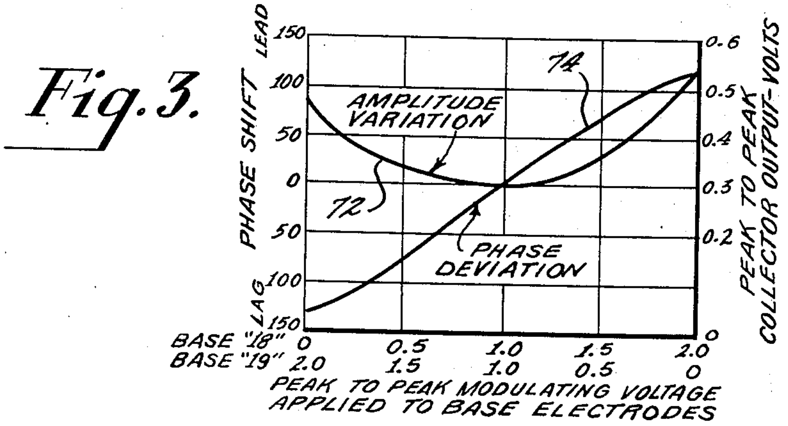

Referring to Figure 3, the modulation signal is plotted along the abscissa of the graph and the phase deviation of the output signal at the collector electrode 16 is plotted along the ordinate. The phase deviation, the curve 74, indicates that the phase deviation of the output signal is nearly linear with respect to the amplitude variations of the modulating signal.

It will be noted that the line OC is shorter than the line O′C at any modulating signal except zero, thus while the output signal will be angle modulated it will also have a component of amplitude modulation thereon as shown on curve 72 of Figure 3. The amplitude modulation component may be eliminated or substantially reduced by moving the virtual base along a curved line, as shown dotted in Figure 1, to insure that the distance between the collector electrode and all possible positions of the virtual base, designated as O″, at all modulation signals will be the same. This may be accomplished by injecting a portion of the modulating signal into the second pair of base contacts in order to make the virtual base move along an arc of a circle having its center at point C beneath the collector electrode 16 so that all virtual bases such as O″ will fall along this arc, as will be more fully explained with reference to Figure 2. This amplitude modulation effect may also be reduced or minimized in other ways. For instance, if the phase angle is held to a small value, the amplitude modulation will not be great enough to cause concern. The emitter electrode may also be given a suitable shape to maintain the line O′C equal in length to the line OC, that is, to shape the locus along which the virtual base moves so that the virtual base is at all times at the same distance from the collector electrode 16.

Figure 2:
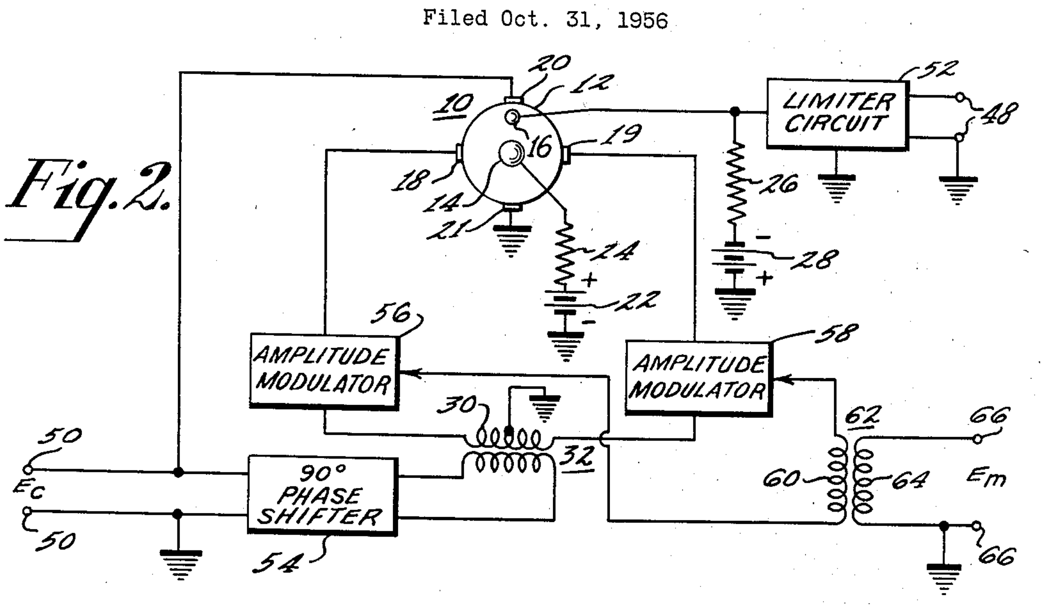
Figure 2 is a schematic circuit diagram of a practical embodiment of the invention; and, Figure 3 is a graph showing curves illustrating certain operational features of the circuits of Figures 1 and 2.

Referring now to Figure 2, an angle modulator circuit utilizing a multi-electrode device includes a multi-electrode transistor identical with that shown in Figure 1. The emitter electrode 14 is again biased through the resistor 24 and battery 22, and the collector electrode 16 is connected through the load resistor 26 to the battery 28. A single carrier frequency signal, $E_C$, is provided for both pairs of base contacts, and is applied to a pair of carrier input terminals 50 for the purpose of injecting the carrier frequency signal into the second pair of base contacts 20, 21. The carrier signal is also supplied to the first pair of base contacts 18, 19 through a 90° phase shifter network 54 and a carrier signal transformer 32. The end terminals of the secondary winding 30 of the transformer 32 are connected through suitable amplitude modulators 56 and 58 to the first pair of base contacts 18, 19. The amplitude modulators 56 and 58 are supplied with modulating signal by connecting them respectively to the ends of the secondary winding 60 of a modulation transformer 62, and the modulating signal, $E_m$, is applied directly to the primary winding 64 through a pair of modulation input terminals 66. In the absence of an input modulation signal through the transformer 62, it will be seen that unmodulated 90° out of phase pair of carrier signals will be applied to the base contacts 18, 19 and 20, 21 and will set up the rotating electrical field within the semiconductor body 12 as previously described with reference to Figure 1.

Two amplitude modulators 56 and 58 are used to modulate the carrier frequency applied to the first pair of base contacts 18, 19 in such a way as to secure balanced modulation. A modulating signal applied to the modulation input terminal 66 will thus modulate the carrier frequency applied to the first pair of base contacts 18, 19 in a manner similar to that hereinbefore described with reference to Figure 1.

The phase deviation of the carrier signal at the collector electrode 16 is the same as that described with reference to Figure 1, and shown on the curve 74 of Figure 3.

A suitable limiter circuit 52 is connected to the collector electrode 16 and the phase deviated carrier signal, which has amplitude modulation thereon, as explained with reference to Figures 1 and 2, is applied directly thereto. The limiter circuit functions to eliminate the amplitude modulation component from the signal and applies a constant amplitude phase modulated signal to the output terminals 48.

Limiting of the output signal appearing at the collector electrode 16 is perhaps the simplest way of reducing the amplitude modulation that appears on the output signal. As previously mentioned, however, the voltage applied to the base electrodes 20 may be varied according to the absolute amplitude of the modulating signal to vary the position of the virtual base along substantially an arc of a circle with the collector electrode 16 as the center. This type of action will also result in a constant amplitude phase deviated wave at the collector electrode 16.

The angle modulated signal appearing at the output terminals 48 may, of course, be applied to one or more frequency multipliers (not shown) in order to increase the modulated carrier frequency and phase deviation to any desired value, since presently available multi-electrode transistor devices operate more satisfactorily at the lower frequencies.

An angle modulator circuit in accordance with the present invention is characterized by its simplicity and economy of components necessary to provide the desired result, and thus it has wide application in angle modulation signal circuits.

What is claimed is:

1. An angle modulator circuit comprising in combination, a semiconductor device having a body of semiconductor material, an emitter electrode and a collector electrode located on said body, and a plurality of ohmic base contacts on said body symmetrically located equidistant about said emitter electrode; means connected with said base contacts for applying carrier signals of the same frequency and suitable phase difference to said contacts for establishing a rotating electrical field within said semiconductor body; means for applying a modulation signal to said base contacts; and means connected with said device for deriving an angle-modulated output signal from said collector electrode having a center frequency equal to the frequency of said carrier signals.

2. An angle modulator circuit comprising in combination, a semiconductor device having a body of semiconductor material, an emitter electrode located on one surface of said body, a collector electrode located on said body and spaced away from said emitter electrode, and a plurality of base contacts on said body located symmetrically about said emitter electrode and equidistant therefrom in opposed pairs; means for applying suitably phased carrier frequency signals of the same frequency to opposed pairs of said base contacts to establish a rotating electrical field within said semiconductor body; circuit means for applying a modulation signal to one of said pairs of base contacts to amplitude modulate the carrier frequency signal thereon; and output circuit means for deriving an angle-modulated output signal from said collector electrode.

3. An angle modulator signal circuit comprising in combination, a transistor device having a semiconductor body, an emitter electrode positioned on one surface of said body, a collector electrode spaced away from said emitter electrode, and two pairs of ohmic base contacts affixed to said body symmetrically located about the emitter electrode and equidistant therefrom in opposed pairs; means for applying a first carrier frequency signal to a first opposed pair of said base contacts; means for applying a second carrier frequency signal having the same frequency as said first carrier signal but displaced in phase by 90° therefrom to a second opposed pair of base contacts; said applied carrier frequency signals being effective to establish a rotating electrical field within said semiconductor body for controlling the current flow between said emitter and collector electrodes; means for applying a modulation signal to said first pair of base contacts to amplitude modulate the first carrier wave signal; and means for deriving an angle-modulated carrier signal from said collector electrode.

4. A signal modulator circuit for developing an angle-modulated signal wave comprising in combination, a transistor device having a semiconductor body, an emitter electrode positioned on one surface of said body, a collector electrode spaced away from said emitter electrode; and two pairs of ohmic base contacts on said body symmetrically located about the emitter electrode and equidistant therefrom in opposed pairs; means for applying a first carrier frequency signal to a first opposed pair of said base contacts; means for applying a second carrier frequency signal having the same frequency as said first carrier frequency signal but displaced in phase by 90° therefrom to a second opposed pair of base contacts; said carrier frequency signal establishing a rotating electrical field within said semiconductor body for controlling the current flow between said emitter and collector electrodes; means for applying a modulation signal to said first pair of base contacts; means for deriving an angle-modulated output signal from said collector electrode; and means connected with said transistor device for effecting operation thereof to reduce amplitude variations of said output signal.

5. An angle modulator circuit comprising in combination a transistor device having a semiconductor body, an emitter electrode positioned on one surface of said body, a collector electrode located on said semiconductor body in spaced relation from said emitter electrode, and four ohmic base contacts affixed to said body symmetrically located about the emitter electrode and equidistant therefrom in opposed pairs; means for applying a first carrier frequency signal to a first opposed pair of said base contacts; means for applying a second carrier signal at the same frequency of said first carrier signal but displaced in phase by 90° therefrom to a second opposed pair of base contacts; said carrier frequency signal establishing a rotating electrical field within said semiconductor body for controlling the current flow between said emitter and collector electrodes, means for amplitude modulating said first carrier frequency signal in accordance with a modulating signal, means for deriving an angular modulated output signal from said collector electrode, and limiter means connected with said collector electrode for reducing amplitude modulation appearing on said output signal.

No references cited.